(12) United States Patent
Yabuuchi et al.

(10) Patent No.: US 6,767,678 B2
(45) Date of Patent: Jul. 27, 2004

(54) PHOTOSOLDER RESIST COMPOSITION

(75) Inventors: Naoya Yabuuchi, Toyonaka (JP); Minoru Fujita, Ibaraki (JP); Osamu Namba, Takarazuka (JP); Keiichi Okajima, Osaka (JP)

(73) Assignee: Nippon Paint Co., Ltd., Osaka (JP)

( * ) Notice: Subject to any disclaimer, the term of this patent is extended or adjusted under 35 U.S.C. 154(b) by 0 days.

(21) Appl. No.: 09/988,036

(22) Filed: Nov. 16, 2001

(65) Prior Publication Data
US 2002/0090573 A1 Jul. 11, 2002

(30) Foreign Application Priority Data

Nov. 17, 2000 (JP) ........................................ 2000-351298
Nov. 1, 2001 (JP) ........................................ 2001-335994

(51) Int. Cl.[7] ................... G03F 7/028; G03F 7/038; G03F 7/32; G03F 7/38; G03F 7/40
(52) U.S. Cl. .................. 430/18; 430/311; 430/280.1; 430/282.1; 430/281.1; 430/283.1; 430/284.1; 430/285.1; 430/287.1; 430/288.1; 522/85; 522/121
(58) Field of Search ........................... 430/18, 311, 315, 430/280.1, 285.1, 281.1, 282.1, 283.1, 284.1, 287.1, 288.1

(56) References Cited

U.S. PATENT DOCUMENTS 5,462,835 A * 10/1995 Mirle et al. ............... 430/287.1
5,741,621 A * 4/1998 Kempf et al. ................ 430/253
5,741,622 A * 4/1998 Arima ..................... 430/270.1
6,004,705 A * 12/1999 Masaki et al. ................ 430/15
6,342,322 B1 * 1/2002 Kakinuma et al. ............ 430/17

FOREIGN PATENT DOCUMENTS

| EP | 0624824 A1 | 5/1994 | ........... G03F/7/038 |
| JP | 8-29980 A * | 2/1996 | ........... G03F/7/038 |
| JP | 11-249302a * | 9/1999 | ........... G03F/7/027 |

OTHER PUBLICATIONS

124:356233, Ca, copyright 2003 ACS, Chemical Abstract of JP 08029980 A2, Shioda, one page.*
Derwent–Acc–No: 1999–575243, copyright 1999 Derwent Information LTD, 2 pages, Abstract of JP 11249302 A.*
Database WPI XP002191907, English Abstract of JP 08-160616A, no date.
Database WPI XP002191908, English Abstract of JP 08-28980A, no date.

* cited by examiner

Primary Examiner—Cynthia Hamilton
(74) Attorney, Agent, or Firm—Townsend and Banta

(57) ABSTRACT

A photosolder resist composition of the invention is characterized by containing (A) a resin containing radical polymerization groups and carboxyl groups obtained by adding a cyclic ether group of a cyclic ether group-containing vinyl monomer to a carboxylic group of a radical copolymer containing at least isobornyl (meth) acrylate and a carboxyl group-containing vinyl monomer as monomer units; (B) an inorganic filler; and (C) a photocurable mixture of a polyfunctional acrylic monomer (c1), a cyclic ether group-containing compound (c2), and a photopolymerization initiator (c3).

12 Claims, No Drawings

PHOTOSOLDER RESIST COMPOSITION

BACKGROUND OF THE INVENTION

1. Field of the Invention

The present invention relates to a photosolder resist composition which can be alkali developed, and also to a solder resist film formed using the composition.

2. Related Art

As a method for applying a solder to predetermined pares of a printed circuit board, generally employed is a method for forming a solder resist pattern on a printed circuit board. A solder resist is for applying a solder to the parts where the pattern is not formed and preventing solder from applying to the parts where the pattern is formed, and at the same time protecting the circuit in the parts where the pattern is formed.

Mounting electronic parts on a printed circuit board has recently been densified and a solder resist is required to be fine. Hence, a method for patterning a solder resist by photolithographic method tends to become a general method and for such a purpose, a liquid photosolder resist has been employed.

As such a photosolder resist composition, Japanese Patent No. 2868190 discloses a modified epoxy resin obtained by adding acrylic acid to a polyfunctional epoxy resin and adding an acid anhydride to a hydroxyl group produced by the reaction is used.

However, such a modified epoxy resin has a problem that the resin is inferior in acid resistance and alkaline resistance since the resin contains an ester bond easy to be hydrolyzed in a molecule. Therefore, there occurs a problem that defects are easily caused in a gold plating process to be carried out thereafter. Further, since brittleness is high, there is another problem of inferior thermal impact resistance. Furthermore, owing to the epoxy-modified resin, a high cost is also a problem.

Japanese Patent Laid-Open No. 191737 (2000) proposes an acrylic resin-based photosolder resist. However, since the acrylic resin-based resist has high hydrophilicity, the resist has a problem that it is inferior in water resistance and electric properties

SUMMARY OF THE INVENTION

The purpose of the invention is to provide a photosolder resist composition excellent in gold plating resistance, thermal impact resistance, and electric insulating properties and to provide a solder resist film formed using the composition.

The photosolder resist composition of the invention contains (A) a resin containing radical polymerization groups and carboxyl groups obtained by adding a cyclic ether group of a cyclic ether group-containing vinyl monomer to a carboxylic group of a radical polymer containing at least isobornyl (meth)acrylate and a carboxyl group-containing vinyl monomer as monomer units; (B) an inorganic filler; and (C) a photocurable mixture of a polyfunctional acrylic monomer (c1), compound containing a cyclic ether group (c2), and a photopolymerization initiator (c3).

The photosolder resist composition of the invention is excellent in acid resistance and alkaline resistance, and consequently excellent in gold plating resistance and at the same time in thermal impact resistance and electric insulating properties since the composition contains the above-described resin (A), inorganic filler (B) and photocurable mixture (C).

The resin (A) is preferable to have double bonds of $0.1 \times 10^{-3}$ to $3.0 \times 10^{-3}$ mol/g. In addition, the content of the carboxyl group (acid value) is preferably 30 to 200 mgKOH/g.

The ratio of the carboxyl group in the resin (A) and the cyclic ether group in the photocurable mixture (C), that is, in the compound (c2) is preferably (1.3/0.7) to (0.7/1.3) by mole.

Further, the solder resist composition of the invention may further contain a coloring pigment.

The content of the inorganic filler (B) is preferably 5 to 75 parts by weight in 100 parts by weight of solid content of the entire photosolder resist composition of the invention.

Further, in the invention, the resin (A) may be neutralized by a base and made water-soluble.

The solder resist film of the invention is obtained by applying the photosolder resist composition of the invention to a substrate, drying at 50 to 90° C., exposing by activation energy beam, removing and developing non-exposed parts with an alkaline washing solution, and heating and curing the photocured parts at 140 to 170° C.

Hereinafter, detailed description will be given respectively for the resin (A), i.e. the first component, the inorganic filler (B), i.e. the second component, and the photocurable mixture (C), i.e the third component, of the photosolder resist composition of the invention.

(A) The Resin Containing a Radical Polymerization Group and a Carboxyl Group The first component contained in the photosolder resist composition of the invention is a resin containing a radical polymerization group and a carboxyl group, and can be obtained by ring-opening addition of a cyclic ether group of a cyclic ether group-containing vinyl monomer to a carboxylic group of a radical copolymer containing at least isobornyl (meth) acrylate and a carboxyl group-containing vinyl monomer as monomer units. The content of isobornyl (meth)acrylate contained in the resin (A) is preferably 10 to 50% by weight and further preferably 15 to 35% by weight. If less than 10% by weight, the tack property and the thermal resistance may be insufficient and if more than 50% by weight, the brittleness may become too high.

Examples of the carboxyl group-containing vinyl monomer are acrylic acid, methacrylic acid and the like. As an example of the cyclic ether group-containing vinyl monomer, glycidyl methacrylate is typical one and also usable is 3,4-epoxycyclohexyl methacrylate, disclosed in Japanese Patent Laid-Open No. 191737(2000). However, from a viewpoint of an addition reactivity, the material cost and the like, glycidyl methacrylate is especially preferable to be used.

The resin (A) containing a radical polymerization group and a carboxyl group contains at least one radical polymerization group and carboxyl group in one molecule, in which the double bonds are preferably $0.1 \times 10^{-3}$ to $3.0 \times 10^{-3}$ mol/g and further preferably $1.0 \times 10^{-3}$ to $3.0 \times 10^{-3}$ mol/g, and the content of the carboxyl group is preferably 30 to 200 mgKOH/g. If the double bonds are less than $1.0 \times 10^{-3}$ mol/g, the photocurable property of the obtained resist may become insufficient so that there is possibility to result in deterioration of adhesion and thermal resistance at the time of development, and if they are more than to $3.0 \times 10^{-3}$ mol/g, not only the film strength may become brittle but also the resolution property may be deteriorated. Further, if the content of the carboxyl group is less than 30 mgKOH/g, the alkaline development property may be deteriorated, and if it more than 200 mgKOH/g, even the exposed parts may be dissolved. The double bonds are further preferably $1.5 \times 10^{-3}$ to $2.7 \times 10^{-3}$ mol/g and the content of the carboxyl group is further preferably 70 to 120 mgKOH/g.

The number average molecular weight of the resin (A) is preferably 2,000 to 40,000. If it is less than 2,000, the heat resistance of the obtained resist may be insufficient, and if it is more than 40,000, the viscosity may become too high and there sometimes occurs a problem on the workability at the time of producting the composition.

In the invention, a base may be added to the resin (A) to neutralize the carboxyl group so as to use the resin (A) as an aqueous solution. The above-described base is not particularly restricted and usable are well-known neutralization agents for carboxylic group, for example, inorganic substances such as sodium hydroxide, potassium hydroxide, and lithium hydroxide; and amine compounds such as triethylamine and dimethylethanolamine. The amount of the above-described base is properly determined corresponding to the molecular weight of the resin (A) and the content of the carboxyl group and may be proper to make the resin (A) water soluble and, for example, the amount may be set to be sufficient to neutralize 30 to 200% (0.3 to 2 mole) of that of carboxyl group.

(B) Inorganic Filler

The second component contained in the aqueous photosolder resist composition of the invention is an inorganic filler. The inorganic filler is used to improve the heat resistance of the resist and usable are well known substances such as barium sulfate, finely powdered silicon carbide, amorphous silica, talc, mica and the like. Additionally, the above-described inorganic filler includes a well-known fire retardant. Incidentally, the above-described inorganic filler can be dispersed by a known method in the presence of the resin (A)

The amount of the above-described inorganic filler is determined as a ratio to the entire solid content of the photosolder resist composition of the invention. The ratio will be described later in the description of the photosolder resist composition.

(C) Photocurable Mixture

The third component contained in the photosolder resist composition of the invention is a mixture of a polyfunctional acrylic monomer (c1), a compound containing cyclic ether group (c2), and a photopolymerization initiator (c3).

<Polyfunctional acrylic monomer (c1)>

The above-described polyfunctional acrylic monomer (c1) may be any compound having two or more polymerization groups (for example, acryloyl group or methacryloyl group) in one molecule, and it is possible to make photocuring for patterning by including the polyfunctional acrylic monomer (c1). Practical examples of the above-described polyfunctional acrylic monomer (c1) are pentaerythritol triacrylate, dipentaerythritol pentacrylate, polyethylene glycol diacrylate, polypropylene glycol diacrylate, trimethylolpropane triacrylate, pentaerythritol tetraacrylate, dipentaerythritol hexacrylate and methacrylates corresponding to the above-described acrylates. They may be used solely or in combination of two or more of them.

<Cyclic ether group-containing compound (c2)>

The above-described compound containing cyclic ether group (c2) is to be heated to cause curing reaction with the carboxyl group of the resist composition [mainly of the resin (A)]. Examples of those which the cyclic ether group is glycidyl are well-known compounds such as bisphenol type, phenol novolak type, cresol novolak type, epoxylated polybutadiene and the like. A variety of compounds are commercialized as those having alicyclic epoxy group and examples are Celloxide series, Epoleed series, Cyclomer series and their polymers sold by Daicel Chem. Ind., Ltd. Further, as those having oxetane group, sold by Toagosei Chemical Industry Co., Ltd. are Aron Oxetane series. Among them, taking the storage stability of a mono-liquid state mixture of (A), (B) and (C) into consideration, preferable are those having 2 or more alicyclic epoxy groups or oxetane groups in one molecule, whose reaction rate is slow as compared with those having glycidyl groups and especially preferably are those having 3 or more of the groups.

<Photopolymerization initiator (c3)>

As the above-described photopolymerization initiator (c3), well-known compounds may be used. Practical examples are benzoin and benzoin alkyl ethers such as benzoin, benzoin methyl ether, benzoin ethyl ether, benzoin propyl ether and the like; acetophenones such as acetophenone, 2,2-dimethoxy-2-phenylacetophenone, 2,2-diethoxy-2-phenylacetophenone, 1,1-dichloroacetophenone and the like; aminoacetophenones such as 2-methyl-1-[4-(methylthio)phenyl]-2-morpholinopropanone-1,2-benzyl-2-dimethylamino-1-(4-morpholinophenyl)-butancne-1, N,N-dimethylaminoacetophenone and the like; anthraquinones such as 2-methylanthraquinone, 2-ethylanthraquinone, 2-tert-butylanthraquinone, 1-chloroanthraquinone and the like; thioxanthones such as 2,4-dimethylthioxanthone, 2,4-diethylthioxanthone, 2-chlorothioxanthone, 2,4-diisopropylthioxanthone and the like; ketals such as acetochenone dimethyl ketal., benzyl dimethyl ketal and the like; benzophenones or xanthones such as benzophenone, 4,4'-bisdiethylaminobenzophenone and the like; and phosphine oxide such as 2,4,6-trimethylbenzoyldiphenylphosphine oxide. These compounds may be used solely or as a mixture of two or more of them and further, a tertiary amines such as triethanolamine and a photoinitiator promotor such as ethyl dimethylaminobenzoate may be added to use.

The weight ratios of the above-described polyfunctional acrylic monomer (c1), compound containing cyclic ether group (c2), and photopolymerization initiator (c3) in the photocurable mixture contained in the photosolder resist composition of the invention are determined as the ratios to the entire solid content contained in the photosolder resist composition of the invention. The ratios will be described later in the description of the photosolder resist composition.

Further, the above-described photocurable mixture may further contain a compound containing an amino group such as dicyanediamide, and melamine and blocked isocyanate and the like which are reacted with a cyclic ether group, other than the above-described components.

Photosolder Resist Composition

The photosolder resist composition of the invention contains (A) a resin containing radical polymerization groups and carboxyl groups obtained by adding a cyclic ether group of a cyclic ether group-containing vinyl monomer to a carboxylic group of a radical copolymer containing at least isobornyl (meth) acrylate and a carboxyl group-containing vinyl monomer as monomer units; (B) an inorganic filler; and (C) a photocurable mixture of a polyfunctional acrylic monomer (c1) a compound containing a cyclic ether group (c2), and a photopolymerization initiator (c3).

The photosolder resist composition of the invention can be obtained by mixing the above-described components by a method well known by skilled in the art. At that time, the ratios of the respective components preferably satisfy the following conditions in order to improve the capabilities of the resist composition and the resist obtained from the composition.

At first, the ratio of the carboxyl groups of the resin (A) to the cyclic ether groups of the photocurable mixture (C) is preferably from (1.3/0.7) to (0.7/1.3) by mole ratio. If the ratio is out of the range, the cross-linking degree may not be increased, thereby resulting in insufficient heat resistance. Further, the ratio is more preferably from (1.15/0.85) to (0.85/1.15).

Next, the inorganic filler (B) is preferably in a ratio of 5 to 75 parts by weight to 100 parts by weight of the entire solid content of the photosolder resist composition of the invention. If less than 5 parts by weight, in some cases, the effect of preventing the heat resistance and curing shrinkage becomes insufficient and if more than 75 parts by weight, in some cases, the development property is deteriorated. The ratio is more preferably 15 to 60 parts by weight.

The polyfunctional acrylic monomer (c1) contained in the photocurable mixture (C) is preferably in a ratio of 2.0 to 15.0 parts by weight to 100 parts by weight of the entire solid content of the photosolder resist composition of the invention. If less than 2.0 parts by weight, in some cases, the photocurable property is insufficient and if more than 15.0 parts by weight, in some cases, the cold heat impact resistance is deteriorated.

On the other hand, the photopolymerization initiator (c3) contained in the photocurable mixture (C) is preferably in a ratio of 0.5 to 7.5 parts by weight to 100 parts by weight of the entire solid content of the photosolder resist composition of the invention. If less than 0.5 parts by weight, in some cases, the photocurable property is insufficient and if more than 7.5 parts by weight, in some cases, the hardness of a film is possibly lowered since the polymerization degree is too low at the time of photocuring. The ratio is more preferably 1.0 to 5.0 parts by weight.

The compound containing the cyclic ether group (c2) contained in the photocurable mixture (C) is preferably in a ratio of 5.0 to 15 parts by weight to 100 parts by weight of the entire solid content of the photosolder resist composition of the invention. If less than 5.0 parts by weight, in some cases, the heat resistance is insufficient owing to low curing density and if more than 15 parts by weight, in some cases, the cured film becomes brittle. Further, the ratio is more preferably 7.5 to 12.0 parts by weight.

The photosolder resist composition of the invention may contain an internal solvent other than the above-described components based on necessity. The solvent is used as an assisting agent for making a film even and capable of dissolving the oil components among the above-described components therein and has a boiling point of 120 to 250° C., preferably 135 to 200° C., and practical examples are propylene alycol diacetate, dipropylene glycol monomethyl ether, propylene glycol monomethyl ether acetate and the like. In the case of using such an internal solvent, it is added preferably in 100 parts by weight or lower, more preferably in 25 parts by weight or lower, to 100 parts by weight of the entire solid content of the photosolder resist composition of the invention.

Further, the photosolder resist composition of the invention may contain a coloring pigment. As the coloring pigment, usable are well-know pigments such as phthalocyanine copper, phthalocyanine chloride, Quinacridine Red and the like. In the case of including a coloring pigment, the pigment is added preferably in a ratio of 0.02 to 4.0 parts by weight to 100 parts by weight of the entire solid content of the photosolder resist composition of the invention. If less than 0.02 parts by weight, in some cases, the coloring property is insufficient and if more than 4.0 parts by weight, in some cases, the film is possibly parted at the time of development owing to deterioration of the photocurable property. The ratio is more preferably 0.05 to 1.0 parts by weight.

The photosolder resist composition of the invention can be obtained by mixing the above-described components and generally, at first the resin (A) is produced and then the inorganic filler (B) and if necessary a coloring pigment are added to the resin and then the respective components of the photocurable mixture (C) and an internal solvent if necessary are added and the resulting mixture is made uniform. In form of products, possible are two-liquid mixture type ones consisting of a mixture of the resin (A) and the inorganic filler (B) and the photocurable mixture (C), and one-liquid type ones containing all of the resin (A), the inorganic filler (B) and the photocurable mixture (C).

The photosolder resist composition of the invention may be used while being emulsified by neutralizing the resin (A) with a base and making the resin water soluble, removing the solvent contained in the resin based on necessity, adding the inorganic filler (B) and a coloring pigment if necessary and dispersing them, and after that, adding the respective components of the photocurable mixture (C) and an internal solvent based on necessity. Since the water-soluble photosolder resist composition can be used while using a lessened amount of a solvent, it is extremely advantageous from the viewpoint of scarce malodor emission and good working environments. The particle diameter of the emulsion of the photosolder resist composition of the invention obtained in such a manner is preferably 0.1 to 10.0 $\mu$m and more preferably 0.3 to 2.0 $\mu$m in the surface area average particle diameter. If it is smaller than 0.1 $\mu$m, it may be difficult to produce and if it is larger than 10.0 $\mu$m, precipitation or flocculation of particles sometimes takes place.

The ratio of the solid content of the photosolder resist composition of the invention is preferably 30 to 90% by weight and more preferably 40 to 70% by weight. If it is less than 30% by weight, the economical efficiency may be slight and if it is more than 90% by weight, it may be difficult to produce since the viscosity becomes too high.

The photosolder resist composition of the invention is applied to a base material such as a substrate and generally dried at 50 to 90° C. After drying, activation energy beam such as UV ray is radiated to carry out exposure and the non-exposed parts are developed and removed with an alkaline washing solution and further the photocured parts are heated at, for example, 140 to 170° C. to promote thermal curing and obtain a solder resist film.

DESCRIPTION OF THE PREFERRED EMBODIMENTS

PRODUCTION EXAMPLE 1

Production of (A) Resin Containing Radical Polymerization Groups and Carboxylic Groups A separable flask of 2 L capacity and equipped with a reflux pipe, a temperature adjusting apparatus, and a stirring blade was loaded with 760 parts by weight of carbitol acetate and the temperature was adjusted at 120° C. To the flask, a mixed solution of 200 parts by weight of isobornyl methacrylate, 300 parts by weight of methacrylic acid, and 7.5 parts by weight of tert-butylperoxy-2-ethylhexanoate was dropped for 2 hours and reaction was continued further for another one hour. Then, a mixed solution of 50 parts by weight of carbitol acetate and 0.75 parts by weight of tert-butylperoxy-2-ethylhexanoate was dropped for 30 minutes, reaction was continued further for another one hour, and the temperature of the reaction was increased to 130° C. and kept for 2 hours. To the resulting mixture, a mixture of 310 parts by weight of glycidyl methacrylate, 1.5 parts by weight of triphenylphosphine, and 1.5 parts by weight of hydroquinone was added and reaction was continued for 8 hours under airflow. The obtained product had the weight average molecular weight of 16,200 and the acid value of 92.8 mgKOH/g. The quantity of the double bonds was $2.76 \times 10^{-3}$ mol/g.

PRODUCTION EXAMPLE 2

Production of (A) Resin Containing Radical Polymerization Groups and Carboxylic Groups A separable flask of 2 L capacity and equipped with a reflux pipe, a temperature adjusting apparatus, and a stirring blade was loaded with 760 parts by weight of carbitol acetate and the temperature was adjusted at 120° C. To the flask, a mixed solution of 140 parts by weight of isobornyl methacrylate, 60 parts by weight of cyclohexyl methacrylate, 300 parts by weight of methacrylic acid, and 7.5 parts by weight of tert-butylperoxy-2-ethylhexanoate was dropped for 2 hours and reaction was continued for another one hour. Then, a mixed solution of 50 parts by weight of carbitol acetate and 0.75 parts by weight of tert-butylperoxy-2-ethylhexanoate was dropped for 30 minutes and reaction was continued for another one hour and the temperature of the reaction was increased to 130° C. and kept for 2 hours. To the resulting mixture, a mixture of 310 parts by weight of glycidyl methacrylate, 1.5 parts by weight of triphenylphosphine, and 1.5 parts by weight of hydroquinone was added and reaction was continued for 8 hours under airflow. The obtained product had the weight average molecular weight of 17,300 and the acid value of 92.2 mgKOH/g. The quantity of the double bonds was $2.80 \times 10^{-3}$ mol/q.

PRODUCTION EXAMPLE 3

Production of (A) Resin Containing Radical Polymerization Groups and Carboxylic Groups A separable flask of 2 L capacity and equipped with a reflux pipe, a temperature adjusting apparatus, and a stirring blade was loaded with 760 parts by weight of propylene glycol monomethyl ether and the temperature was adjusted at 110° C. To the flask, a mixed solution of 140 parts by weight of isobornyl methacrylate, 60 parts by weight of styrene, 300 parts by weight of methacrylic acid, and 17.5 parts by weight of tert-butylperoxy-2-ethylhexanoate was dropped for 2 hours and reaction was continued for another one hour. Then, a mixed solution of 50 parts by weight of propylene glycol monomethyl ether and 0.75 parts by weight of tert-butylperoxy-2-ethylhexanoate was dropped for 30 minutes and reaction was continued further for 3 hours and the temperature reaction was increased to 120° C. and kept for 3 hours To the resulting mixture, a mixture of 300 parts by weight of glycidyl methacrylate, 1.5 parts by weight of triphenylphosphine, and 1.5 parts by weight of hydroquinone was added and reaction was continued for 8 hours under airflow. The obtained product had the weight average molecular weight of 18,300 and the acid value of 90.5 mgKOH/g. The quantity of the double bonds was $2.70 \times 10^{-3}$ mol/g.

PRODUCTION EXAMPLE 4

Production of (A) Water-Soluble Resin

To 200 g of the resin solution of the production example 3, 20 g of triethylamine and 600 g of ion exchanged water were added and stirred for 1 hour and some of the solvent and water were removed by reduced pressure to obtain an aqueous solution containing 30.0% by weight of solid content.

PRODUCTION EXAMPLE 5

Production of Epoxy Resin (Conventional Example) Containing Radical Polymerization Groups and Carboxylic Groups A separable flask of 2 L capacity and equipped with a reflux pipe, a temperature adjusting apparatus, and a stirring blade was loaded with 400 parts by weight of EOCN-104S (cresol novolak type epoxy resin produced by Nippon Kayaku Co., Ltd.), 740.5 parts by weight of carbitol acetate, 0.50 parts by weight of hydroquinone, and 1.20 parts by weight of triphenylphosphine and the temperature was adjusted at 90° C. under airflow. To the flask, 148.3 parts by weight of acrylic acid was dropped for 30 minutes and reaction was further continued for 24 hours. At that time, the acid value was around zero. Then, 192.2 parts by weight of tetrahydrophthalic acid anhydride was added and reaction was continued further for 10 hours. The obtained product had the acid value of 93.2 mgKOH/g.

PRODUCTION EXAMPLE 6

Production of Epoxy Resin (Conventional Example) Containing Radical Polymerization Groups and Carboxylic Groups A separable flask of 2 L capacity and equipped with a reflux pipe, a temperature adjusting apparatus, and a stirring blade was loaded with 400 parts by weight of EOCN-104S (cresol novolak type epoxy resin produced by Nippon Kayaku Co., Ltd.), 740.5 parts by weight of propylene glycol monomethyl ether, 0.50 parts by weight of hydroquinone, and 1.20 parts by weight of triphenylphosphine and the temperature was adjusted at 90° C. under airflow. To the flask, 148.3 parts by weight of acrylic acid was dropped for 30 minutes and reaction was further continued for 24 hours. At that time, the acid value was around zero. Then, 192.2 parts by weight of tetrahydrophthalic acid anhydride was added and reaction was continued further for 10 hours. The obtained product had the acid value of 93.9 mgKCH/g.

PRODUCTION EXAMPLE 7

Production of Water-Soluble Resin (Conventional Example)

To 200 g of the resin solution of the production example 6, 20 g of triethylamine and 600 g of ion exchanged water were added and stirred for 1 hour and some of the solvent and water were removed by reduced pressure to obtain an aqueous solution containing 30.0 % by weight of solid content.

PRODUCTION EXAMPLE 8

Production of Resin (Reference Example) Containing Radical Polymerization Groups and Carboxylic Groups Production was carried out in the same manner as the production example 1, except that methyl methacrylate was used in place of isobornyl methacrylate. The obtained product had the weight average molecular weight of 19,600 and the acid value of 94.2 mgKOH/g.

PRODUCTION EXAMPLE 9-1

Production of (C) Photocurable Mixture

A photocurable mixture was produced by mixing 150 parts by weight of trimethylol propane trimethacrylate and 40 parts by weight of pentaerythritol tetraacrylate as the polyfunctional acrylic monomer (c1), 22.0 parts by weight of Irgacure 907 (a photopolymerization initiator, produced by Ciba-Geigy Corp.) and 8.0 parts by weight of diethylthioxanthone as the photopolymerization initiator (c3), and 180 parts by weight of EHPE 3150 (a polyfunctional epoxy compound, produced by Daicel Chem. Ind., Ltd.) as the compound containing cyclic ether group (c2), and 100 parts by weight of propylene glycol monomethyl ether acetate as an internal solvent.

PRODUCTION EXAMPLE 9-2

Production of (C) Photocurable Mixture

A photocurable mixture was produced by mixing 110 parts by weight of bisphenol F type difunctional acrylate (M-208, produced by Toagosei Chemical Industry Co., Ltd.) and 80 parts by weight of pentaerythritol tetraacrylate as the polyfunctional acrylic monomer (c1), 22.0 parts by weight of Irgacure 907 (a photopolymerization initiator, produced by Ciba-Geigy Corp.) and 8.0 parts by weight of diethylthioxanthone as the photopolymerization initiator (c3) and 144 parts by weight of EHPE 3150 (a polyfunctional epoxy compound, produced by Daicel Chem. Ind., Ltd.) and 36 parts by weight of Epoleed GT-403 (a polyfunctional epoxy compound, produced by Daicel Chem. Ind., Ltd.) as the compound containing cyclic ether group (c2), and 100 parts by weight of propylene glycol monomethyl ether acetate as an internal solvent.

PRODUCTION EXAMPLE 9-3

Production of (C) Photocurable Mixture

A photocurable mixture was produced by mixing 100 parts by weight of bisphenol A type difunctional acrylate (VR-77, produced by Showa Highpolymer Co., Ltd.) and 90 parts by weight of ditrimethylol propanetetraacrylate as the polyfunctional acrylic monomer (c1), 22.0 parts by weight of Irgacure 907 (a photopolymerization initiator, produced by Ciba-Geigy Corp.) and 8.0 parts by weight of diethylthioxanthone as the photopolymerization initiator (c3), and 144 parts by weight of EHPE 3150 (a polyfunctional epoxy compound, produced by Daicel Chem. Ind., Ltd.) and 36 parts by weight of Epoleed PB-3600 (an epoxylated polybutadiene, produced by Daicel Chem. Ind., Ltd.) as the compound containing cyclic ether group (c2), and 100 parts by weight of propylene glycol monomethyl ether acetate as an internal solvent.

PRODUCTION EXAMPLE 9-4

Production of (C) Photocurable Mixture

A photocurable mixture was produced by mixing 100 parts by weight of bisphenol F type difunctional acrylate (M-208, produced by Toagosei Chemical Industry Co., Ltd.) and 70 parts by weight of ditrimethylol propanetetraacrylate as the polyfunctional acrylic monomer (c1), 22.0 parts by weight of Irgacure 907 (a photopolymerization initiator, produced by Ciba-Geigy Corp.) and 8.0 parts by weight of diethylthioxanthone as the photopolymerization initiator (c3), and 24 parts by weight of YD-013 (a polyfunctional epoxy compound, produced by Tohto Kasei Co., Ltd.) and 216 parts by weight of EOCN-104S (a polyfunctional epoxy compound, produced by Nippon Kayaku Co., Ltd.) as the compound containing cyclic ether group (c2), and 60 parts by weight of dipropylene glycol dimethyl ether and 60 parts by weight of propylene glycol monomethyl ether acetate as an internal solvent.

PRODUCTION EXAMPLE 10

Production of Pigment Dispersion

The resin solution (50% by weight of solid content) of the production example 1 of 360 parts by weight, B-34 (barium sulfate, produced by Sakai Chemical Industry Co., Ltd.) of 298 parts by weight, and Phthalocyanine Blue of 2.0 parts by weight were mixed by a roll mill.

PRODUCTION EXAMPLE 11

Production of Pigment Dispersion

The resin solution (50% by weight of solid content) of the production example 2 of 360 parts by weight, B-34 (barium sulfate, produced by Sakai Chemical Industry Co., Ltd.) of 298 parts by weight, and Phthalocyanine Blue of 2.0 parts by weight were mixed by a roll mill.

PRODUCTION EXAMPLE 12

Production of Pigment Dispersion

The aqueous resin solution (30% by weight of solid content) of the production example 4 of 600 parts by weight, B-34 (barium sulfate, produced by Sakai Chemical Industry Co , Ltd.) of 298 parts by weight, Phthalocyanine Blue of 2.0 parts by weight, and ion exchanged water of 60 parts by weight were mixed by a Dinomill.

PRODUCTION EXAMPLE 13

Production of Pigment Dispersion

The resin solution (50% by weight of solid content) of the production example 5 of 360 parts by weight, B-34 (barium sulfate, produced by Sakai Chemical Industry Co., Ltd.) of 298 parts by weight, and Phthalocyanine Blue of 2.0 parts by weight were mixed by a roll mill.

PRODUCTION EXAMPLE 14

Production of Pigment Dispersion

The aqueous resin solution (30% by weight of solid content) of the production example 7 of 600 parts by weight, B-34 (barium sulfate, produced by Sakai Chemical Industry Co., Ltd.) of 298 parts by weight, Phthalocyanine Blue of 2.0 parts by weight, and ion exchanged water of 60 parts by weight were mixed by a Dinomill.

PRODUCTION EXAMPLE 15

Production of Pigment Dispersion

The resin solution (50% by weight of solid content) of the production example 8 of 360 parts by weight, B-34 (barium sulfate, produced by Sakai Chemical Industry Co., Ltd.) of 298 parts by weight, and Phthalocyanine Blue of 2.0 parts by weight were mixed by a roll mill.

EXAMPLE 1

Production of Photosolder Resist Composition No. 1

The solution of the photocurable mixture (C) obtained in production example 9-1 of 50 parts by weight and the pigment dispersion obtained in production example 10 of 220 parts by weight were mixed.

EXAMPLE 2

Production of Photosolder Resist Composition No. 2

The solution of the photocurable mixture (C) obtained in production example 9-1 of 50 parts by weight and the pigment dispersion obtained in production example 11 of 220 parts by weight were mixed.

EXAMPLE 3

Production of Water-Soluble Photosolder Resist Composition No. 1

The solution of the photocurable mixture (C) obtained in production example 9-1 of 50 parts by weight and the pigment dispersion obtained in production example 12 of 320 parts by weight were mixed.

EXAMPLE 4

Production of Water-Soluble Photosolder Resist Composition No. 2

The solution of the photocurable mixture (C) obtained in production example 9-2 of 50 parts by-weight and the pigment dispersion obtained in production example 12 of 320 parts by weight were mixed.

EXAMPLE 5

Production of Water-Soluble Photosolder Resist Composition No. 3

The solution of the photocurable mixture (C) obtained in production example 9-3 of 50 parts by weight and the pigment dispersion obtained in production example 12 of 320 parts by weight were mixed.

EXAMPLE 6

Production of Water-Soluble Photosolder Resist Composition No. 4

The Solution of the Photocurable Mixture (C) obtained in production example. 9-4 of 50 parts by weight and the pigment dispersion obtained in production example 10 of 246 parts by weight were mixed.

COMPARATIVE EXAMPLE 1

Production of Photosolder Resist Composition No. 3

The solution of the photocurable mixture (C) obtained in production example 9-1 of 50 parts by weight and the pigment dispersion obtained in production example 13 of 220 parts by weight were mixed.

COMPARATIVE EXAMPLE 2

Production of Water-soluble Photosolder Resist Composition No. 5

The Solution of the photocurable mixture (C) obtained in production example 9-1 of 50 parts by weight and the pigment dispersion obtained in production example 14 of 320 parts by weight were mixed.

COMPARATIVE EXAMPLE 3

Production of Photosolder Resist Composition No. 4

The solution of the photocurable mixture (C) obtained in production example 9-1 of 50 parts by weight and the pigment dispersion obtained in production example 15 of 220 parts by weight were mixed.

The mixing ratios of the above-described examples 1 to 6 and the comparative examples 1 to 3 are collectively shown in Table 1. Incidentally, Table 1 also shows the mole ratio of [carboxyl groups in the resin (A)/cyclic ether groups of the photocurable mixture (C)] in the respective photosolder resist compositions and the content of the inorganic fillers (by parts by weight in 100 parts by weight of the solid content of the respective photosolder resist compositions) in the respective photosolder resist compositions.

TABLE 1

| | Pigment Dispersion | | Photocurable | [Carboxyl Groups of the Resin (A)]/[Cyclic Ether Groups of the Photocurable | Content of Inorganic Filler* (Parts by |
|---|---|---|---|---|---|
| | (A) + (B) | (A) | Mixture (C) | Mixture (C)] | Weight) |
| Example 1 | Production Example 10 | Production Example 1 | Production Example 9-1 | 51/49 | 50 |
| Example 2 | Production Example 11 | Production Example 2 | Production Example 9-1 | 51/49 | 50 |
| Example 3 | Production Example 12 | Production Example 4 | Production Example 9-1 | 49/51 | 50 |
| Example 4 | Production Example 12 | Production Example 4 | Production Example 9-2 | 51/49 | 50 |
| Example 5 | Production Example 12 | Production Example 4 | Production Example 9-3 | 51/49 | 50 |
| Example 6 | Production Example 10 | Production Example 1 | Production Example 9-4 | 54/46 | 50 |
| Comp. Example 1 | Production Example 13 | Production Example 5 | Production Example 9-1 | 51/49 | 50 |
| Comp. Example 2 | Production Example 14 | Production Example 7 | Production Example 9-1 | 51/49 | 50 |
| Comp. Example 3 | Production Example 15 | Production Example 8 | Production Example 9-1 | 51/49 | 50 |

*a blue-color pigment is included in the inorganic filler content

<Evaluation test>

Each of the photosolder resist compositions of the examples 1 to 6 and the comparative examples 1 to 3 was applied to a substrate bearing a patterned copper foil for evaluation of the development property, the solder heat resistance, the gold plating resistance, and thermal impact resistance and to a combteeth-type electrode coupon of IPCB-25 for evaluation of the electric insulating property, by screen printing in the film thickness of 23 to 27 μm, respectively, and dried at 80° C. for 20 minutes. After drying, being covered with a negative film, each resulting film was exposed with 200 mj/cm² and developed with an aqueous sodium carbonate solution at 1 kg/cm² spraying pressure and then cured by heating at 150° C. Each resulting resist film was evaluated according to the following evaluation standards. Further, the storage stability of the pigment dispersions was also evaluated.

Development property: evaluation was performed by eye observation based on the degree of elimination of lines of 50/50 (μm) of the obtained copper foil-bearing substrate.

Solder heat resistance: evaluation was performed by eye observation based on the state of blistering and peeling of the resist layer after a rosin type flux was applied to the obtained copper foil-bearing substrate and then the substrate was immersed in a solder tank previously set at 260° C. and then the flux was washed out with a denatured alcohol. The evaluation standards were as follows:

◎: no peeling was observed even after repeating the immersion for 10 seconds 6 times or more:

○: no peeling was observed even after repeating the immersion for 10 seconds 3 to 5 times:

Δ: peeling was slightly observed if the immersion for 10 seconds was repeated 3 times or more: and X: blistering and peeling were observed if the immersion for 10 second was carried out one time.

Electric insulating property: the volume intrinsic resistance was measured according to ASTM D 257.

Gold plating resistance: the evaluation was performed by tape peeling after plating while the plating thickness being adjusted to be 0.1 μm.

Cold heat impact resistance: a tape peeling test was carried out after repeating 200 cycles of heating at the maximum temperature 125° C. and cooling at the minimum temperature −65° C. for 10 retention duration for each temperature.

Storage stability of pigment dispersions: the appearance was checked after storage for 2weeks at 40° C.

The evaluation results are shown in Table 2.

As being made clear from the results shown in Table 2, the photosolder resist compositions of the examples 1 to 6 according to the invention were found excellent in the development property, having high volume intrinsic resistance, and excellent in the electric insulating property. Further, they were found excellent also in the solder heat resistance, gold plating resistance, and thermal impact resistance. Furthermore, the storage stability of the pigment dispersions was found excellent.

According to the invention, it is made possible to obtain a photosolder resist composition excellent in properties such as gold plating resistance, thermal impact resistance, and electric insulating property.

What is claimed is:

1. A photosolder resist composition containing (A) a resin containing radical polymerization groups and carboxyl groups obtained by adding a cyclic ether group of a cyclic ether group-containing vinyl monomer to a carboxylic group of a radical copolymer containing at least isobornyl (meth) acrylate and a carboxyl group-containing vinyl monomer as monomer units; (B) an inorganic filler; and (C) a photocurable mixture of a polyfunctional acrylic monomer (c1), a cyclic ether group-containing compound (c2), and a photopolymerization initiator (c3).

2. The photosolder resist composition according to claim 1, wherein said resin (A) has double bonds of $0.1 \times 10^{-3}$ to $3.0 \times 10^{-3}$ mol/g and the content of the carboxyl group of 30 to 200 mgKOH/g.

3. The photosolder resist composition according to claim 1, wherein the ratio of the carboxyl group in said resin (A) and the cyclic ether group in said photocurable mixture (C) is (1.3/0.7) to (0.7/1.3) by mole ratio.

4. The photosolder resist composition according to claim 1 further containing a coloring pigment.

5. The photosolder resist composition according to claim 1, wherein the content of said inorganic filler (B) is 5 to 75 parts by weight in 100 parts by weight of solid content of the entire photosolder resist composition.

6. An aqueous emulsion photosolder resist composition obtained by neutralizing said resin (A) according to claim 1 with a base to be water-soluble.

7. The aqueous emulsion type photosolder resist composition according to claim 6, wherein said resin (A) has double bonds of $0.1 \times 10^{-3}$ to $3.0 \times 10^{-3}$ mol/g and the content of the carboxyl group of 30 to 200 mgKOH/g.

8. The aqueous emulsion photosolder resist composition according to claim 6, wherein the said ratio of the carboxyl group in said resin (A) and cyclic ether group in said photocurable mixture (C) is (1.3/0.7) to (0.7/1.3) by mole ratio.

TABLE 2

| | Example | | | | | | Comparative Example | | |
|---|---|---|---|---|---|---|---|---|---|
| | 1 | 2 | 3 | 4 | 5 | 6 | 1 | 2 | 3 |
| Development Property (50/50L/S) | Excellent | Excellent | Excellent | Excellent | Excellent | Excellent | Excellent | Insufficient in Development | Inferior Adhesion Strength |
| Volume Intrinsic Resistance (Ω · cm) | $10^{16}$ | $10^{16}$ | $10^{16}$ | $10^{16}$ | $10^{16}$ | $10^{16}$ | $10^{16}$ | $10^{25}$ | $10^{12}$ |
| Solder Heating Resistance | ◎ | ◎ | ◎ | ◎ | ◎ | ◎ | Δ | Δ | x |
| Gold Plating Resistance (Tape Peeling) | Excellent | Excellent | Excellent | Excellent | Excellent | Excellent | Partially Peeled | Partially Peeled | Significant Peeling |
| Thermal Impact Resistance (Tape Peeling) | Excellent | Excellent | Excellent | Excellent | Excellent | Excellent | Partially Peeled | Partially Peeled | Significant Peeling |
| Storage Stability of Dispersions | Excellent | Excellent | Excellent | Excellent | Excellent | Excellent | Excellent | Occurance of Pigment Agglomeration | Excellent |

9. The aqueous emulsion photosolder resist composition according to claim 6, further containing a coloring pigment.

10. The aqueous emulsion photosolder resist composition according to claim 6, wherein the content of said inorganic filler (B) is 5 to 75 parts by weight in 100 parts by weight of solid content of the entire photosolder resist composition.

11. A solder resist film obtained by applying the photosolder resist composition according to claim 1 to a substrate, drying at 50 to 90° C., exposing by activation energy beam, removing and developing non-exposed parts with an alkaline washing solution, and heating and curing the photocurable parts at 140 to 170° C.

12. A solder resist film obtained by applying the photosolder resist composition according to claim 6 to a substrate, drying at 50 to 90° C., exposing by activation energy beam, removing and developing non-exposed parts with an alkaline washing solution, and heating and curing the photocurable parts at 140 to 170° C.

* * * * *